(12) United States Patent
Itokawa

(10) Patent No.: US 9,972,635 B2
(45) Date of Patent: May 15, 2018

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventor: Hiroshi Itokawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/267,948

(22) Filed: Sep. 16, 2016

(65) Prior Publication Data

US 2017/0250189 A1   Aug. 31, 2017

Related U.S. Application Data

(60) Provisional application No. 62/300,949, filed on Feb. 29, 2016.

(51) Int. Cl.
*H01L 27/115* (2017.01)
*H01L 29/423* (2006.01)
(Continued)

(52) U.S. Cl.
CPC .. *H01L 27/11556* (2013.01); *H01L 21/28273* (2013.01); *H01L 21/28506* (2013.01);
(Continued)

(58) Field of Classification Search
CPC ......... H01L 27/11556; H01L 21/28273; H01L 21/28506; H01L 21/3115; H01L 21/28568;
(Continued)

(56) References Cited

U.S. PATENT DOCUMENTS 8,193,577 B2   6/2012   Takashima et al.
9,431,412 B1*  8/2016   Kato ................. H01L 27/11556
(Continued)

FOREIGN PATENT DOCUMENTS

JP   2012-64753 A   3/2012
JP   5472894 B2     4/2014

OTHER PUBLICATIONS

Shyam Raghunathan, et al., "Investigation of Ballistic Current in Scaled Floating-gate NAND Flash and a Solution," IEEE, 2009, pp. 34.1.1-34.1.4.
SungJin Whang, et al., "Novel 3-Dimensional Dual Control-Gate with Surrounding Floating-Gate (DC-SF) NAND Flash Cell for 1Tb File Storage Application" IEEE IEDM Technical Digest, 2010, pp. IEDM10-668-IEDM10-671.

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A semiconductor memory device according to one embodiment, includes an interconnect extending in a first direction, a semiconductor member extending in a second direction crossing the first direction, an electrode provided between the interconnect and the semiconductor member, a first insulating film provided between the interconnect and the electrode, a second insulating film provided between the first insulating film and the electrode, a third insulating film provided between the electrode and the semiconductor member, and a metal-containing layer provided between the first insulating film and the second insulating film or inside the first insulating film, and having a metal surface concentration of $1 \times 10^{14}$ cm$^{-2}$ or more and $5 \times 10^{15}$ cm$^{-2}$ or less.

20 Claims, 13 Drawing Sheets

(51) Int. Cl.
*H01L 21/3115* (2006.01)
*H01L 21/28* (2006.01)
*H01L 21/285* (2006.01)
*H01L 29/788* (2006.01)
*H01L 29/49* (2006.01)
*H01L 27/11556* (2017.01)

(52) U.S. Cl.
CPC .... *H01L 21/3115* (2013.01); *H01L 29/42332* (2013.01); *H01L 29/4916* (2013.01); *H01L 29/7883* (2013.01); *H01L 21/28568* (2013.01); *H01L 29/495* (2013.01)

(58) Field of Classification Search
CPC ........... H01L 29/42332; H01L 29/4916; H01L 29/7883; H01L 29/495
USPC ......................................... 257/315; 438/763
See application file for complete search history.

(56) References Cited

U.S. PATENT DOCUMENTS

| | | | |
|---|---|---|---|
| 2007/0116872 A1* | 5/2007 | Li | C23C 16/12 427/248.1 |
| 2009/0189213 A1* | 7/2009 | Matsuo | H01L 27/115 257/324 |
| 2012/0068159 A1 | 3/2012 | Fujiki et al. | |
| 2014/0291847 A1* | 10/2014 | Zhang | H01L 23/53261 257/751 |
| 2015/0200199 A1* | 7/2015 | Sakamoto | G11C 16/0408 257/329 |
| 2015/0236038 A1* | 8/2015 | Pachamuthu | H01L 27/11582 257/326 |

* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/300,949, filed on Feb. 29, 2016; the entire contents of which are incorporated herein by reference.

FIELD

Embodiments relate to a semiconductor memory device and a method for manufacturing same.

BACKGROUND

Recently, a stacked type semiconductor memory device in which memory cells are three-dimensionally integrated has been proposed. In such a stacked type semiconductor memory device, a stacked body in which an electrode film and an insulating film are alternately stacked on a semiconductor substrate is provided, and a semiconductor member piercing the stacked body is provided. Further, a memory cell is formed at each crossing portion between the electrode film and the semiconductor member. Also such a semiconductor memory device is required to further shrink.

DETAILED DESCRIPTION

A semiconductor memory device according to one embodiment, includes an interconnect extending in a first direction, a semiconductor member extending in a second direction crossing the first direction, an electrode provided between the interconnect and the semiconductor member, a first insulating film provided between the interconnect and the electrode, a second insulating film provided between the first insulating film and the electrode, a third insulating film provided between the electrode and the semiconductor member, and a metal-containing layer provided between the first insulating film and the second insulating film or inside the first insulating film, and having a metal surface concentration of $1 \times 10^{14}$ cm$^{-2}$ or more and $5 \times 10^{15}$ cm$^{-2}$ or less.

A method for manufacturing a semiconductor memory device according to one embodiment includes forming a stacked body by alternately stacking a first film and a second film on a substrate. The method includes forming a first trench extending in a first direction on the stacked body. The method includes forming a first recessed portion extending in the first direction on a side surface of the first trench by removing a portion of the second film through the first trench. The method includes forming a first insulating film on an inner surface of the first recessed portion. The method includes forming a metal-containing layer by introducing a metal into a surface of the first insulating film. The method includes forming a second insulating film on a surface of the first insulating film. The method includes forming an electrode in the first recessed portion. The method includes forming a third insulating film on a side surface of the first trench. The method includes forming a semiconductor member in the first trench. The method includes dividing the semiconductor member, the third insulating film, the electrode, the second insulating film, and the metal-containing layer in the first direction. The method includes forming a second trench extending in the first direction in the stacked body. The method includes forming a second recessed portion extending in the first direction on a side surface of the second trench by removing a residual portion of the second film through the second trench. The method includes forming an interconnect in the second recessed portion.

Hereinafter, an embodiment will be described with reference to the drawings.

Figure 1:
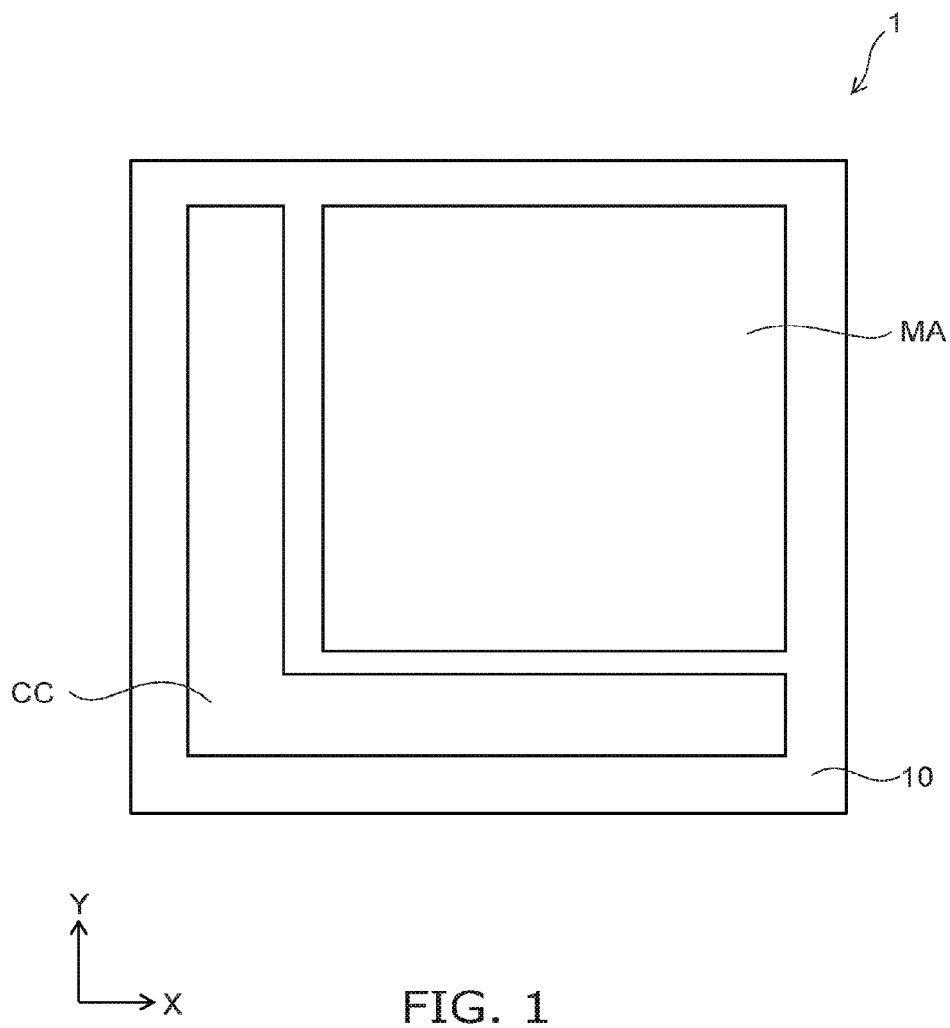
FIG. 1 is a block diagram showing a semiconductor memory device according to an embodiment.

FIG. 1 is a block diagram showing a semiconductor memory device according to the embodiment.

Figure 2:
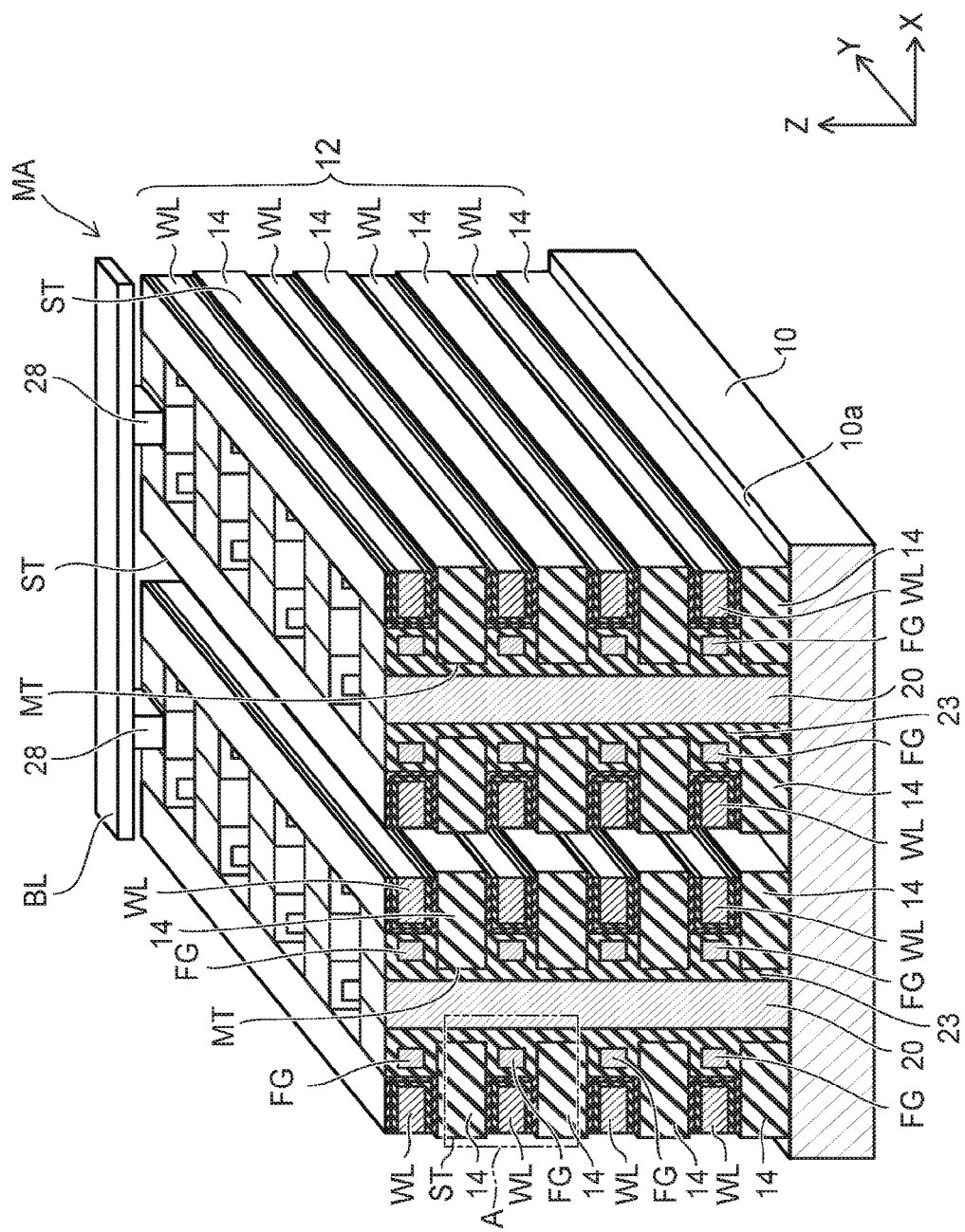
FIG. 2 is a perspective view showing a memory array of the semiconductor memory device according to the embodiment.

FIG. 2 is a perspective view showing a memory array of the semiconductor memory device according to the embodiment.

Figure 3:
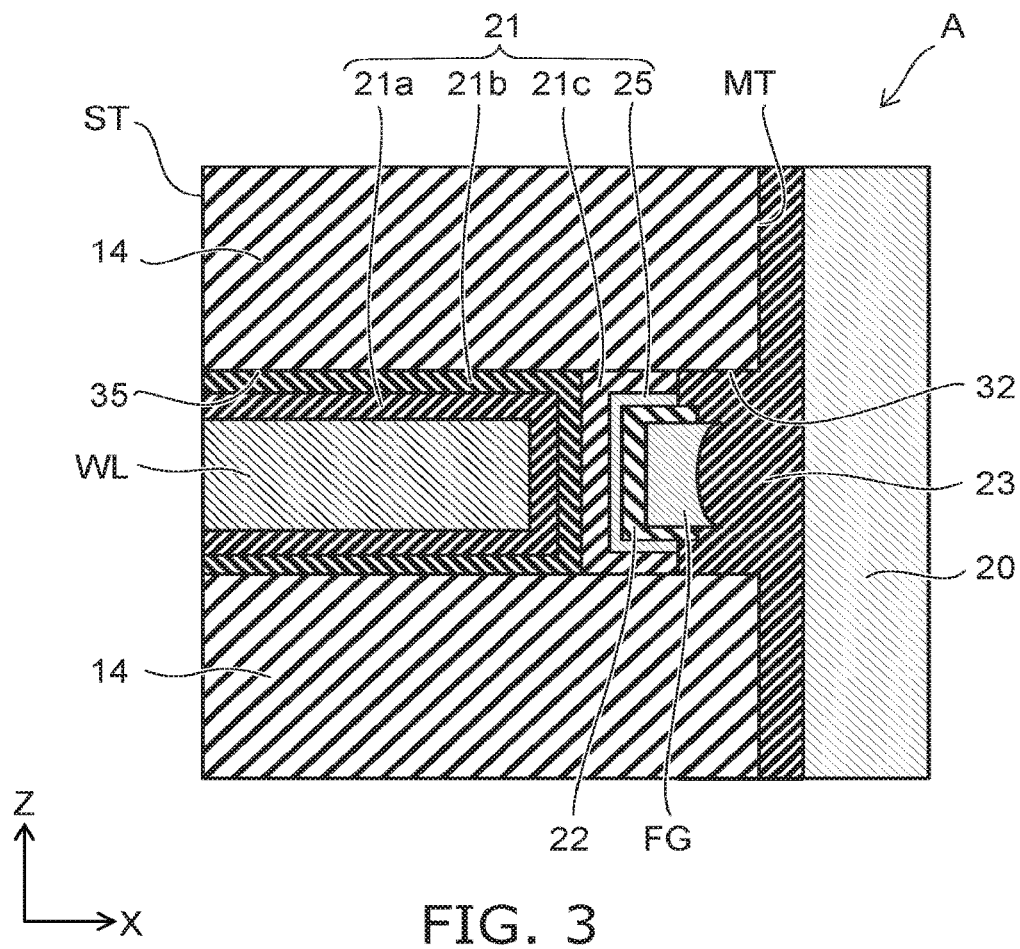
FIG. 3 is a cross-sectional view showing a region A of FIG. 2.

FIG. 3 is a cross-sectional view showing a region A of FIG. 2.

As shown in FIG. 1, in a semiconductor memory device 1 according to the embodiment, in a silicon substrate 10 and on the silicon substrate 10, a memory array MA which stores data and a control circuit CC which drives the memory array MA are provided. The silicon substrate 10 is formed of, for example, a silicon single crystal.

As shown in FIG. 2, in the memory array MA, a stacked body 12 is provided on the silicon substrate 10. Hereinafter, in the specification, for the sake of convenience of description, an XYZ orthogonal coordinate system is adopted. Two directions parallel to an upper surface 10a of the silicon substrate 10 and also orthogonal to each other are referred to as "X-direction" and "Y-direction", and a direction perpendicular to the upper surface 10a of the silicon substrate 10 is referred to as "Z-direction". Further, in the Z-direction, a direction from the silicon substrate 10 to the stacked body 12 is also referred to as "upper", and a direction opposite thereto is also referred to as "lower", however, this distinction is for reference only, and is irrelevant to the direction of gravity.

As shown in FIG. 2, in the stacked body 12, interlayer insulating films 14 composed of, for example, silicon oxide are mutually separately arranged along the Z-direction. In the stacked body 12, a plurality of memory trenches MT extending in the Y-direction and a plurality of slits ST extending in the Y-direction are formed. The memory trenches MT and the slits ST are alternately arranged along the X-direction. Each memory trench MT and each slit ST pierce the stacked body 12 to reach the silicon substrate 10. In the specification, the phrase "a constituent member extends in the Y-direction" means that the direction of the longest dimension of the constituent member is the Y-direction. The other directions are referred to in the same manner. The direction of the longest dimension of each memory trench MT and each slit ST is the Y-direction, and the direction of the second longest dimension is the Z-direction, and the direction of the shortest dimension is the X-direction.

In the stacked body 12, between the memory trench MT and the slit ST in the X-direction and also between the interlayer insulating films 14 in the Z-direction, one word line WL extending in the Y-direction and a plurality of floating gate electrodes FG arranged along the Y-direction are provided. Therefore, in the stacked body 12, the word lines WL are arranged in a two-dimensional matrix along the X-direction and Z-direction. The floating gate electrodes FG are arranged in a three-dimensional matrix along the X-direction, Y-direction, and Z-direction.

The word line WL is composed of a conductive material, and includes, for example, a main body portion (not shown) composed of tungsten (W) and a barrier metal layer (not shown) composed of titanium nitride (TiN). The barrier metal layer is disposed on an upper surface, on a lower surface, and on a side surface facing the floating gate electrode FG of the main body portion. The floating gate electrode FG is composed of a conductive material, and is formed of, for example, polysilicon containing impurities.

In each memory trench MT, a plurality of semiconductor members 20 is provided. The semiconductor members 20 are formed of, for example, silicon. The shape of each semiconductor member 20 is a substantially quadrangular columnar shape extending in the Z-direction, and a lower end thereof is connected to the silicon substrate 10. The plurality of semiconductor members 20 is mutually separately arranged in a line along the Y-direction. In the Y-direction, the semiconductor members 20 and the floating gate electrodes FG are disposed at the same position. Due to this, the floating gate electrode FG is disposed between the semiconductor member 20 and the word line WL. Further, each semiconductor member 20 is disposed between the floating gate electrodes FG separated in the X-direction with the memory trench MT interposed therebetween.

As shown in FIG. 3, between the word line WL and the floating gate electrode FG, a block insulating film 21 is provided. The block insulating film 21 is a film which substantially does not allow a current to flow therethrough even if a given driving voltage output from a control unit CC (see FIG. 1) is applied. In the block insulating film 21, from a side of the word line WL to the floating gate electrode FG, a high dielectric constant layer 21a, a low dielectric constant layer 21b, and a high dielectric constant layer 21c are stacked in this order. The dielectric constants of the high dielectric constant layers 21a and 21c are higher than the dielectric constant of the low dielectric constant layer 21b. The high dielectric constant layer 21a and the low dielectric constant layer 21b are disposed on an upper surface, on a lower surface, and on a side surface facing the floating gate electrode FG of the word line WL. The high dielectric constant layer 21a is in contact with the word line WL.

For example, the high dielectric constant layers 21a and 21c are formed of hafnium silicon oxide (HfSiO), and the low dielectric constant layer 21b is formed of silicon oxide (SiO). Incidentally, the high dielectric constant layers 21a and 21c may be formed of a metal oxide such as zirconium oxide (ZrO) or zirconium silicon oxide (ZrSiO), and the low dielectric constant layer 21b may be formed of aluminum oxide (AlO).

Between the block insulating film 21 and the floating gate electrode FG, an inter-electrode insulating film 22 is provided. The inter-electrode insulating film 22 is disposed on an upper surface, on a lower surface, and on a side surface facing the word line WL of the floating gate electrode FG. The inter-electrode insulating film 22 is formed of an insulating material having a higher barrier height and dielectric constant than silicon oxide, and is formed of, for example, silicon nitride (SiN). Further, the high dielectric constant layer 21c is disposed on an upper surface, on a lower surface, and on a side surface facing the word line WL of the inter-electrode insulating film 22.

Between each semiconductor member 20 and the plurality of floating gate electrodes FG arranged in a line along the Z-direction, a tunneling insulating film 23 is provided. The tunneling insulating film 23 is generally an insulating film, however, when a given driving voltage output from the control circuit CC is applied, it allows a tunneling current to flow therethrough. The tunneling insulating film 23 is formed of, for example, silicon oxide. Incidentally, the tunneling insulating film 23 may be an ONO film obtained by depositing a silicon oxide layer, a silicon nitride layer, and a silicon oxide layer. The shape of the tunneling insulating film 23 is a strip shape extending in the Z-direction. The average dielectric constant of the entire tunneling insulating film 23 is lower than the average dielectric constant of the entire block insulating film 21.

Then, in a portion in contact with the inter-electrode insulating film 22 in the high dielectric constant layer 21c of the block insulating film 21, a metal-containing layer 25 containing a metal, for example, molybdenum (Mo) is formed. In one example, the thickness of the entire high dielectric constant layer 21c is about 5 nm (nanometers), and the thickness of the metal-containing layer 25 therein is about 1 nm. In the metal-containing layer 25, for example, molybdenum is present as a simple substance in the form of a dot or as an alloy with hafnium in the form of a dot. A molybdenum surface concentration in the metal-containing layer 25 is, for example, $1 \times 10^{14}$ cm$^{-2}$ or more and $5 \times 10^{15}$ cm$^{-2}$ or less. Incidentally, in the embodiment, the metal-containing layer 25 is formed inside the block insulating film 21, but may be provided between the block insulating film 21 and the inter-electrode insulating film 22 as a layer independent of the block insulating film 21.

Structure bodies composed of the semiconductor member 20, the tunneling insulating film 23, the floating gate electrode FG, the inter-electrode insulating film 22, and the high dielectric constant layer 21c are mutually separately arranged in the Y-direction. Incidentally, the metal-containing layer 25 is included in the high dielectric constant layer 21c. Between the structure bodies, an insulating material may be buried, or an air gap may be formed. Also in the slit ST, an insulating material may be buried, or an air gap may be formed.

As shown in FIG. 2, on the stacked body 12, a via 28 is provided, and on the via 28, a bit line BL extending in the X-direction is provided. The bit line BL is connected to an upper end of the semiconductor member 20 through the via 28.

Next, an operation of the semiconductor memory device according to the embodiment will be described.

Figure 4:
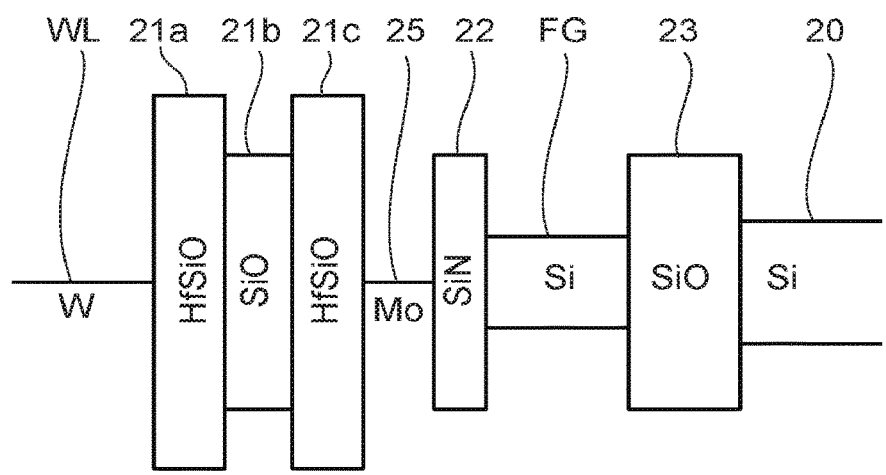
FIG. 4 is a band view showing a memory cell of the semiconductor memory device according to the embodiment.

FIG. 4 is a band view showing a memory cell of the semiconductor memory device according to the embodiment.

Incidentally, examples of materials forming the respective portions are shown in FIG. 4 for facilitating intuitive understanding, however, the materials of the respective portions are not limited to the materials shown in FIG. 4.

As shown in FIG. 3, in the semiconductor memory device 1 according to the embodiment, a memory cell including the floating gate electrode FG is formed at each crossing portion between the semiconductor member 20 and the word line WL. The memory cell is a field-effect transistor, and the semiconductor member 20 functions as a channel, the word line WL functions as a gate, the tunnel insulating film 23 functions as a gate insulating film, and the floating gate electrode FG functions as a floating gate.

At this time, as shown in FIG. 4, the floating gate electrode FG and the metal-containing layer 25 serve an energy level well sandwiched by the tunneling insulating film 23 and the block insulating film 21. Further, the floating gate electrode FG and the metal-containing layer 25 are electrically separated from each other by the inter-electrode insulating film 22.

When data is programmed in a given memory cell (referred to as "selected cell"), the control circuit CC (see FIG. 1) applies a program voltage between the word line WL and the semiconductor member 20 by using the word line WL as a positive electrode and using the semiconductor member 20 as a negative electrode. By doing this, electrons in the semiconductor member 20 flow in the tunneling insulating film 23 as a tunneling current and are injected into the floating gate electrode FG.

The electrons injected into the floating gate electrode FG are partially scattered in the floating gate electrode FG to lose energy and be accumulated in the floating gate electrode FG. The rest of the electrons injected into the floating gate electrode FG do not lose much energy in the floating gate electrode FG and pass through the inter-electrode insulating film 22 while maintaining high energy and collide with the metal-containing layer 25. Then, the electrons are scattered in the metal-containing layer 25 to lose energy, and therefore be accumulated in the metal-containing layer 25. Due to the electrons accumulated in the floating gate electrode FG and in the metal-containing layer 25, a threshold voltage of the memory cell is changed, and data is programmed.

Next, a method for manufacturing a semiconductor memory device according to the embodiment will be described.

FIGS. 5 to 16 are cross-sectional views showing a method for manufacturing a semiconductor memory device according to the embodiment.

Figure 12:
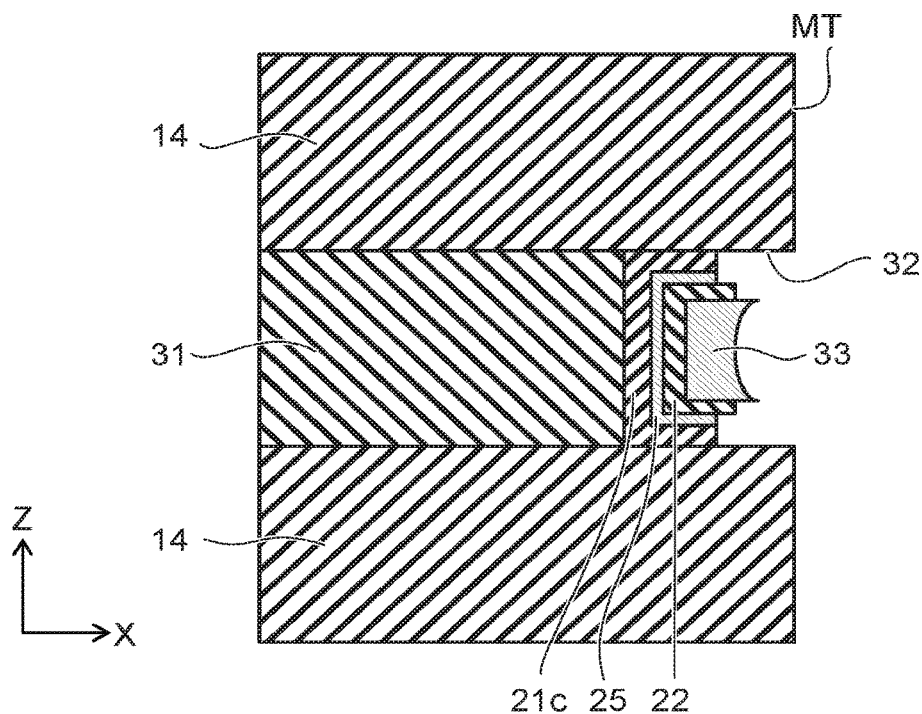
Figure 13:
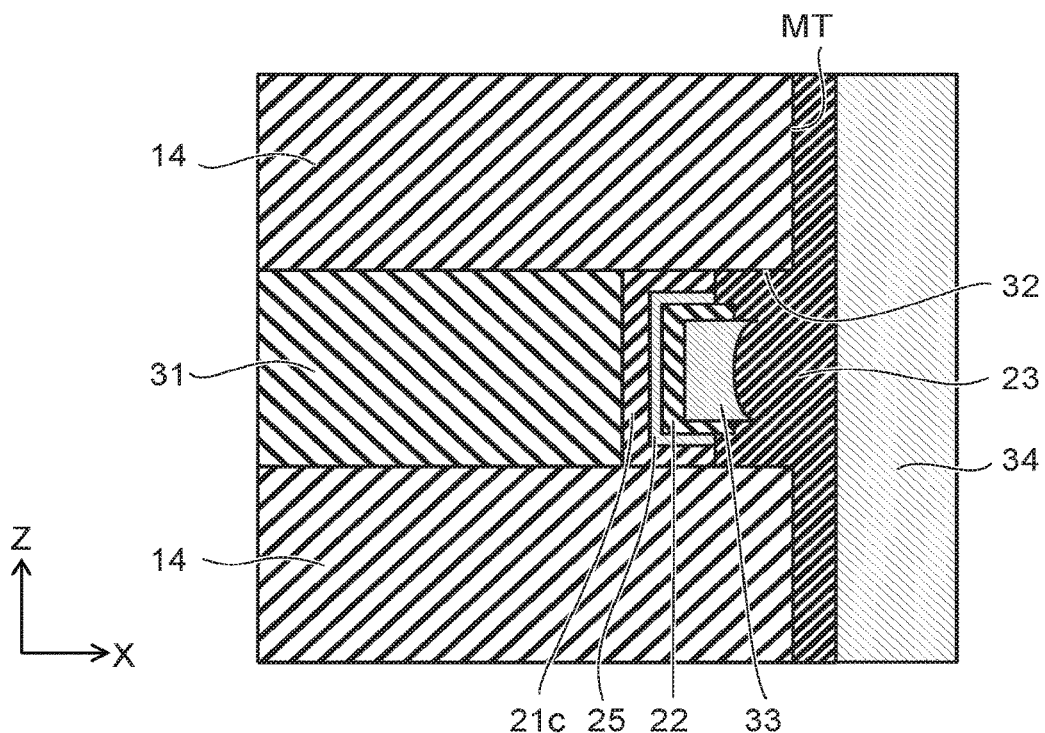
Figure 14:
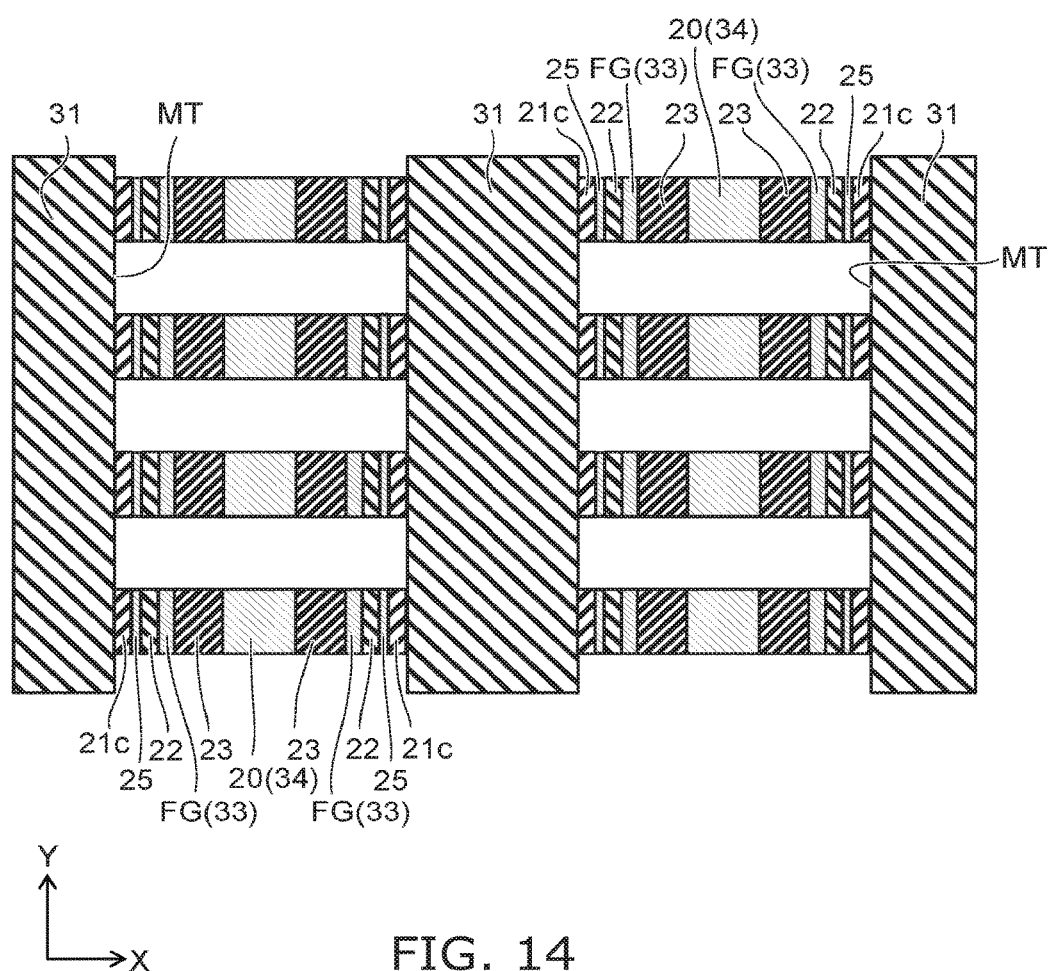

Among FIGS. 5 to 16, the drawings other than FIG. 14 show an XZ cross section. FIGS. 5 to 9, 15, and 16 are overall views, and FIGS. 10 to 13 are partially enlarged views. FIG. 14 shows an XY cross section.

Figure 5:
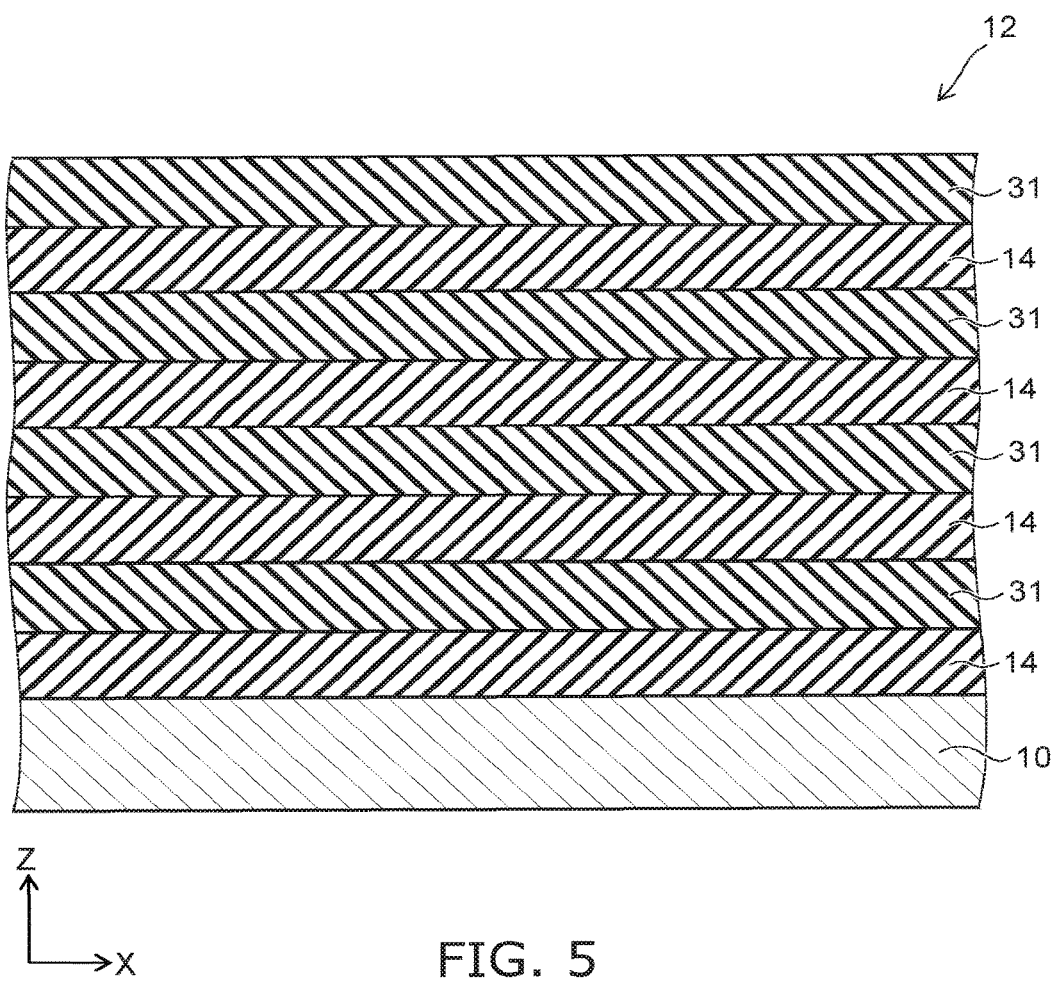
FIGS. 5 to 16 are cross-sectional views showing a method for manufacturing a semiconductor memory device according to the embodiment.

First, as shown in FIG. 5, a silicon substrate 10 is prepared. Subsequently, on the silicon substrate 10, for example, by a CVD (Chemical Vapor Deposition) method, silicon oxide and silicon nitride are alternately deposited. By doing this, an interlayer insulating film 14 composed of silicon oxide and a silicon nitride film 31 are alternately stacked along the Z-direction, whereby a stacked body 12 is formed.

Figure 6:
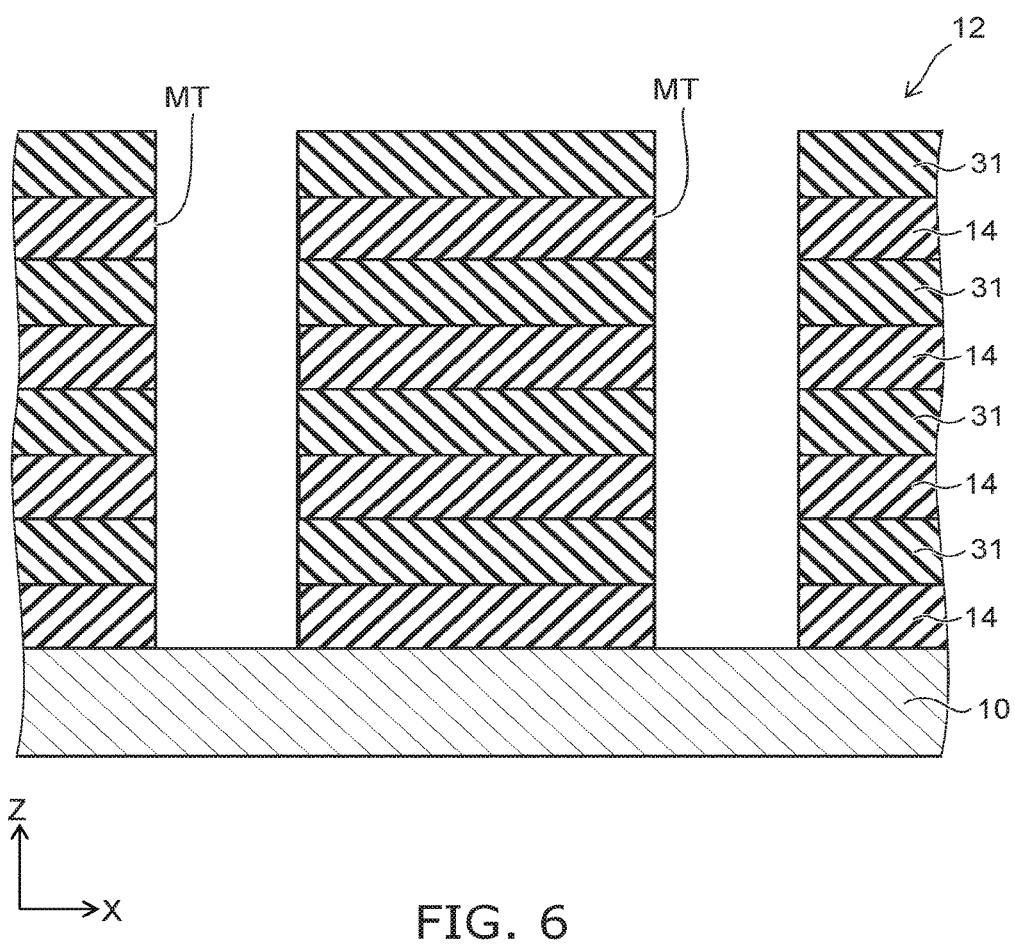

Subsequently, as shown in FIG. 6, for example, by a lithographic method and an RIE (Reactive Ion Etching) method, a plurality of memory trenches MT reaching the silicon substrate 10 and extending in the Y-direction is formed in the stacked body 12.

Figure 7:
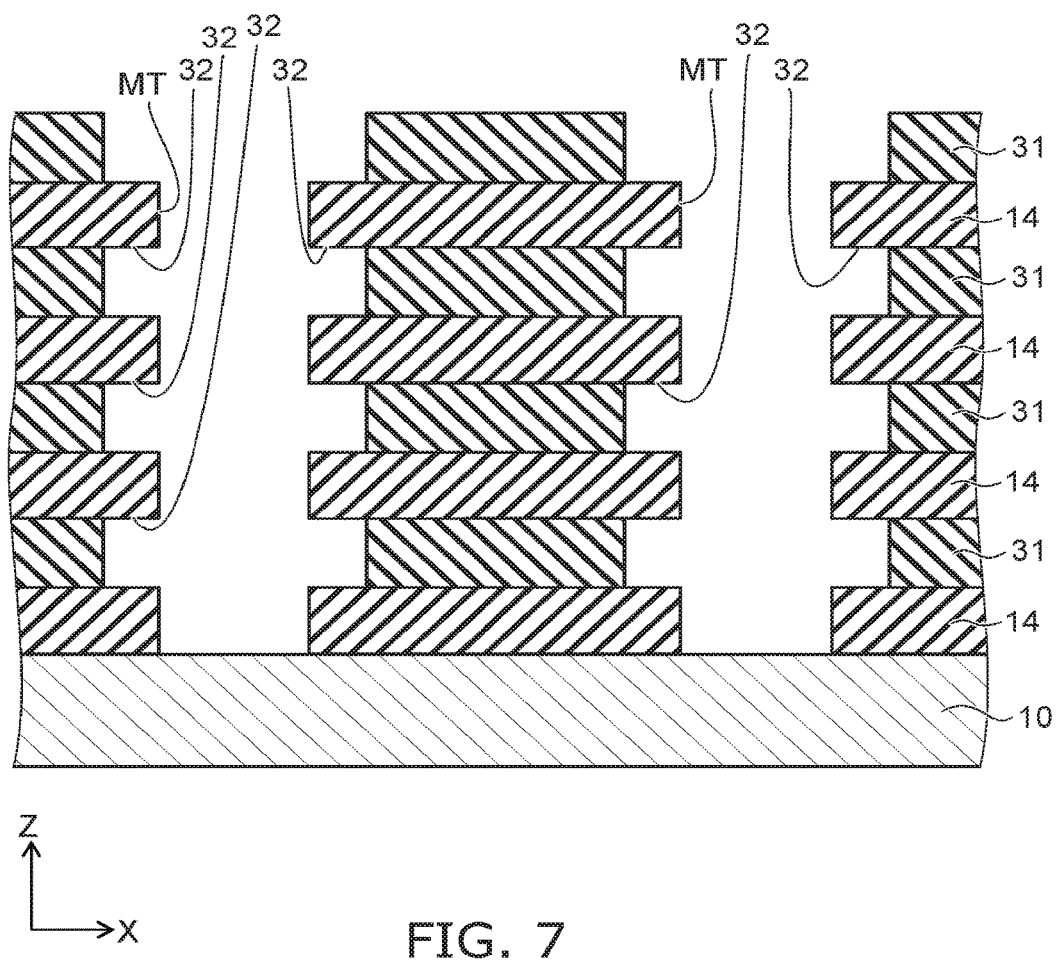

Subsequently, as shown in FIG. 7, through the memory trench MT, for example, wet etching using hot phosphoric acid is performed. By doing this, a portion exposed in the memory trench MT in the silicon nitride film 31 is removed, whereby a recessed portion 32 is formed on a side surface of the memory trench MT. The recessed portion 32 extends in the Y-direction along the memory trench MT.

Figure 8:
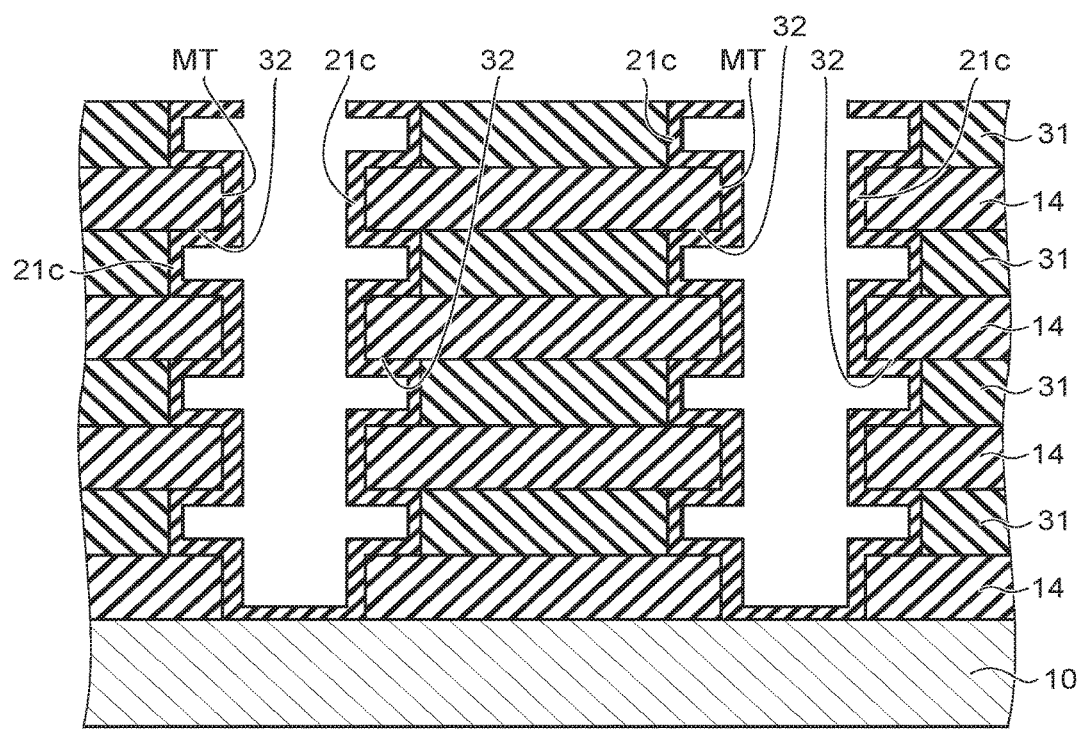
Figure 8:
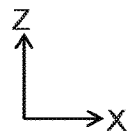

Subsequently, as shown in FIG. 8, for example, by a CVD method, a high dielectric constant material, for example, hafnium silicon oxide (HfSiO) is formed on the entire surface. By doing this, a high dielectric constant layer 21c is substantially uniformly formed on an inner surface of the memory trench MT. The high dielectric constant layer 21c is also formed on an inner surface of the recessed portion 32. A thickness of the high dielectric constant layer 21c is set to, for example, 5 nm. Subsequently, a heat treatment is performed, whereby the high dielectric constant layer 21c is crystallized.

Figure 9:
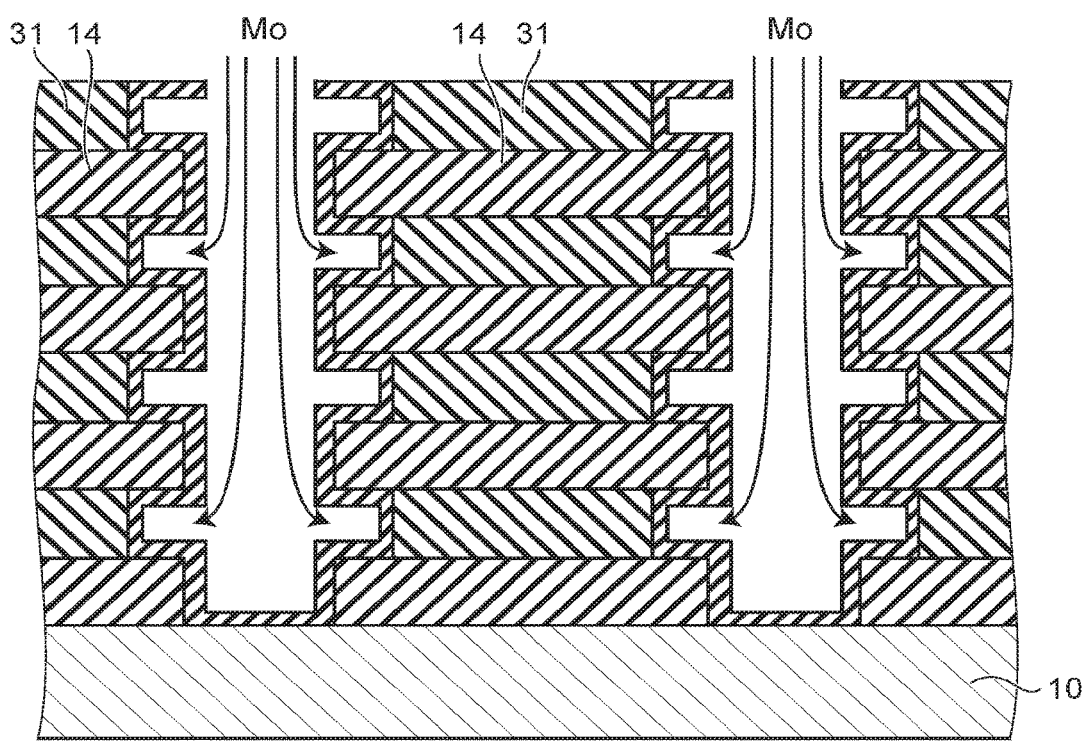

Subsequently, as shown in FIG. 9, for example, by a plasma doping method, molybdenum is introduced into a surface of the high dielectric constant layer 21c. Specifically, a rare gas such as argon (Ar) or helium (He) is introduced into a chamber, and a high frequency power is applied to transform the gas into a plasma, and also a raw material such as molybdenum pentachloride ($MoCl_5$) or molybdenum hexafluoride ($MoF_6$) is introduced. By doing this, a molybdenum atom contained in the raw material is ionized and penetrates into the high dielectric constant layer 21c. However, since a bias voltage is not applied to molybdenum ions, the molybdenum ions remain in a very surface layer portion of the high dielectric constant layer 21c.

Figure 10:
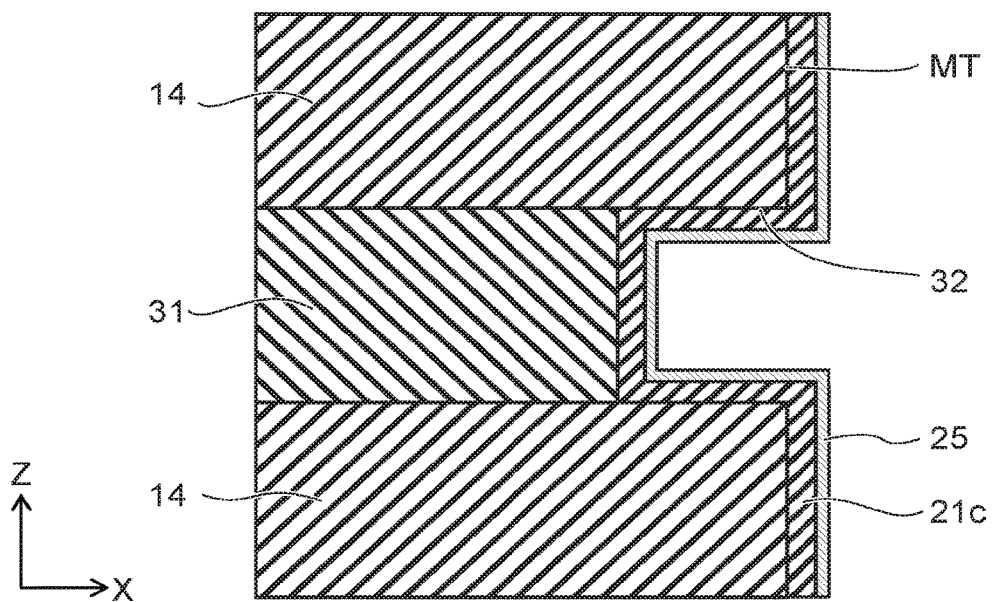

As a result, as shown in FIG. 10, a very thin metal-containing layer 25 is formed in the vicinity of an exposed surface of the high dielectric constant layer 21c. For example, the metal-containing layer 25 has a thickness of about 1 nm and has a molybdenum surface concentration of, for example, $1 \times 10^{14}$ cm$^{-2}$ or more and $5 \times 10^{15}$ cm$^{-2}$ or less. In most cases, a continuous film of molybdenum is not formed, and molybdenum is present in the high dielectric constant layer 21c as a molybdenum simple substance in the form of a dot or as a molybdenum-hafnium alloy in the form of a dot.

Figure 11:
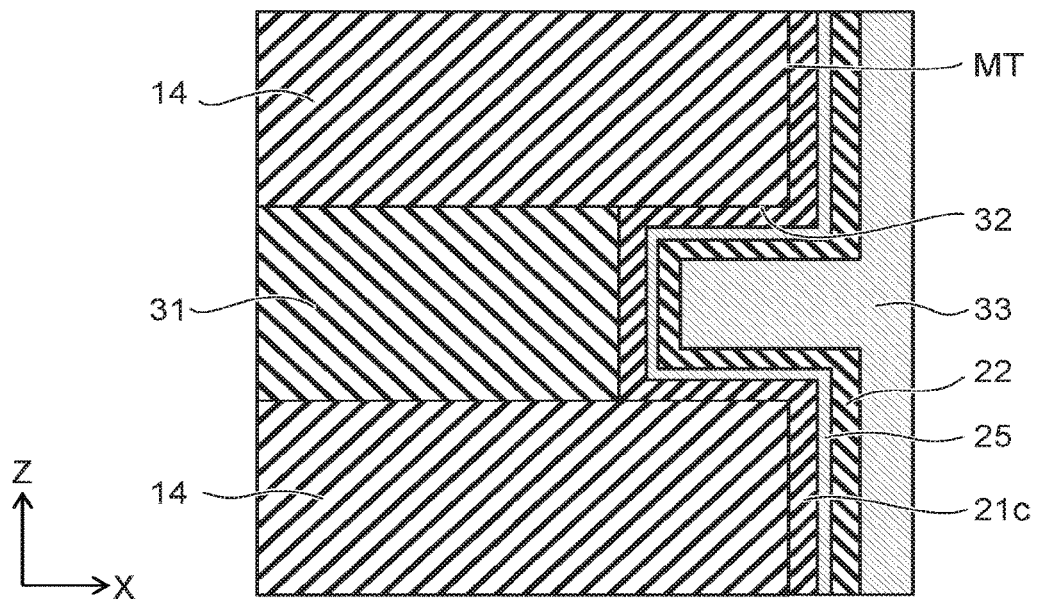

Subsequently, as shown in FIG. 11, for example, by a CVD method, silicon nitride is deposited, whereby an inter-electrode insulating film 22 is formed on an inner surface of the memory trench MT. Subsequently, silicon is deposited, whereby a conductive silicon film 33 is formed on an inner surface of the memory trench MT. The deposition amount of the silicon film 33 is set such that silicon is buried in the recessed portion 32, but is not completely buried in the entire memory trench MT.

Subsequently, as shown in FIG. 12, for example, by performing anisotropic etching such as RIE, a portion deposited outside the recessed portion 32 in the silicon film 33, the inter-electrode insulating film 22, and the high dielectric constant layer 21c is removed. By doing this, the silicon film 33, the inter-electrode insulating film 22, and the high dielectric constant layer 21c are left in the recessed portions 32 and mutually separated between the recessed portions 32.

Subsequently, as shown in FIG. 13, on a side surface of the memory trench MT, silicon oxide is deposited, whereby a tunneling insulating film 23 is formed. Subsequently, silicon is deposited, whereby a semiconductor member 34 is buried in the memory trench MT.

Subsequently, as shown in FIG. 14, the semiconductor member 34, the tunneling insulating film 23, the silicon film 33, the inter-electrode insulating film 22, and the high dielectric constant layer 21c are selectively removed and divided in the Y-direction. As a result, the semiconductor member 34 is divided into a plurality of semiconductor members 20 in each memory trench MT. Further, the silicon film 33 is divided along the Y-direction for each semiconductor member 20, whereby a floating gate electrode FG is formed. Incidentally, a portion excluding the metal-containing layer 25 in the high dielectric constant layer 21c may be left without being divided. Subsequently, in a residual portion of the memory trench MT, silicon oxide (not shown) is buried.

Figure 15:
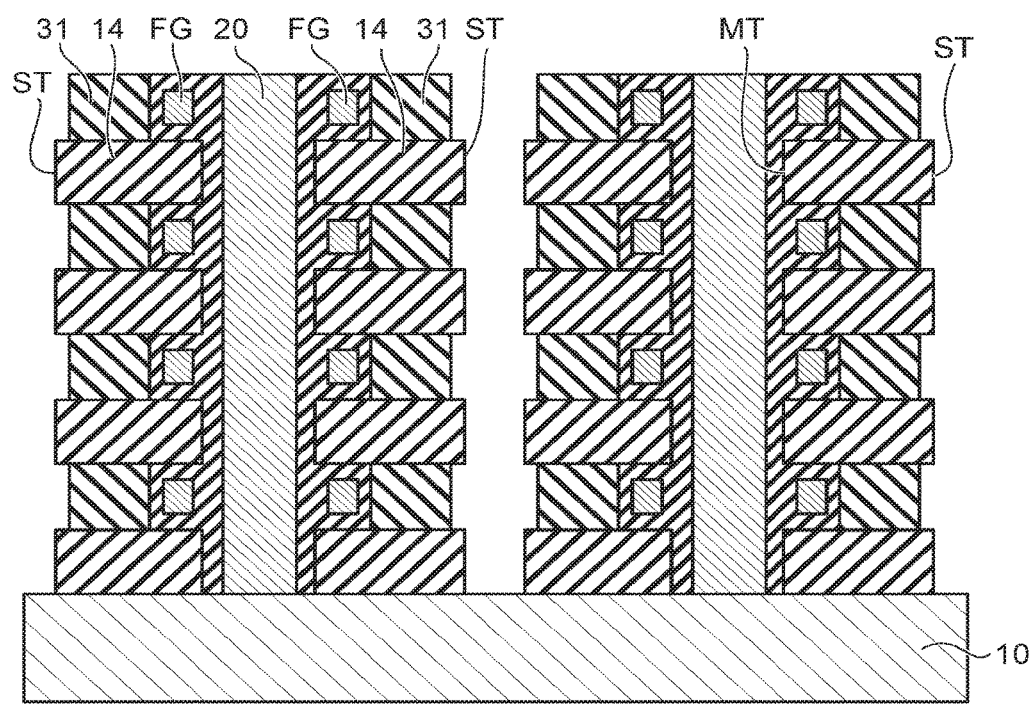

Subsequently, as shown in FIG. 15, in a portion between the memory trenches MT in the stacked body 12, a slit ST extending in the Y-direction is formed. The slit ST is allowed to reach the silicon substrate 10.

Figure 16:
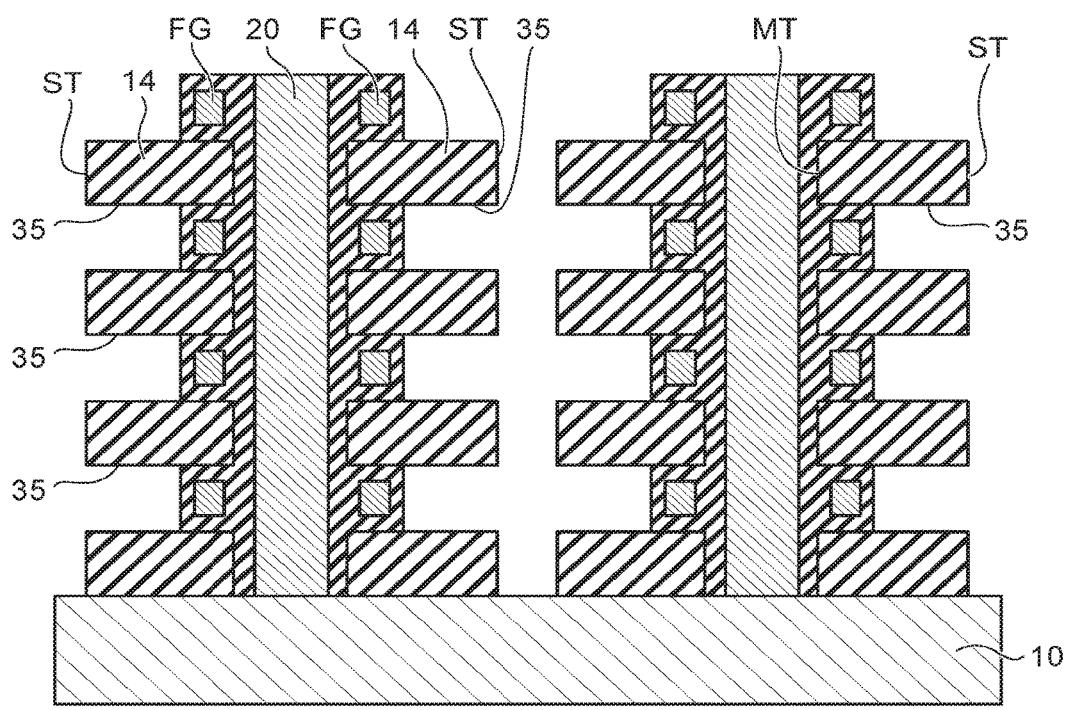

Subsequently, as shown in FIG. 16, etching is performed through the slit ST, whereby a residual portion of the silicon nitride film 31 is removed. For example, wet etching using hot phosphoric acid is performed. At this time, the high dielectric constant layer 21c functions as an etching stopper. By doing this, a recessed portion 35 extending in the Y-direction is formed on a side surface of the slit ST.

Subsequently, as shown in FIG. 3, a low dielectric constant material, for example, silicon oxide is deposited, whereby a low dielectric constant layer 21b is formed on an inner surface of the slit ST. Subsequently, a high dielectric constant material, for example, hafnium silicon oxide is deposited, whereby a high dielectric constant layer 21a is formed. By the high dielectric constant layer 21c, the low dielectric constant layer 21b, and the high dielectric constant layer 21a, a block insulating film 21 is formed.

Subsequently, for example, titanium nitride is deposited, whereby a barrier metal layer is formed on an inner surface of the slit ST, and then, tungsten is deposited. Subsequently, by performing anisotropic etching such as RIE, a portion deposited outside the recessed portion 35 in tungsten and the barrier metal layer is removed. By doing this, tungsten and the barrier metal layer are divided for each recessed portion 35, whereby a word line WL is buried in each recessed portion 35. In addition, also the block insulating film 21 is divided for each recessed portion 35.

Subsequently, as shown in FIG. 2, an insulating film (not shown) is formed on the stacked body 12, and a via 28 is formed in the insulating film and connected to an upper end of the semiconductor member 20. Subsequently, a bit line BL extending in the X-direction is formed on the insulating film and connected to the via 28. By doing this, the semiconductor memory device 1 according to the embodiment is manufactured.

Next, an effect of the embodiment will be described.

As shown in FIG. 3, in the semiconductor memory device 1 according to the embodiment, in a portion in contact with the inter-electrode insulating film 22 in the block insulating film 21, the metal-containing layer 25 containing molybdenum is provided. According to this, among the electrons injected into the floating gate electrode FG from the semiconductor member 20 through the tunneling insulating film 23, electrons passing through the floating gate electrode FG can be trapped by the metal-containing layer 25. Therefore, the semiconductor memory device 1 according to the embodiment has favorable program characteristics.

Further, by providing the metal-containing layer 25, electrons (ballistic electrons) passing through the floating gate electrode FG while maintaining high energy at the time of a program operation can be prevented from colliding with the block insulating film 21, and thus the block insulating film 21 can avoid being damaged. Due to this, the semiconductor memory device 1 has high reliability.

In general, as the thickness of the floating gate electrode FG in the X-direction is thinner, electrons (ballistic electrons) passing through the floating gate electrode FG while maintaining high energy increase, and the probability that the floating gate electrode FG can trap electrons decreases. Therefore, if the metal-containing layer 25 is not provided, when the floating gate electrode FG becomes thinner accompanying the shrink of the semiconductor memory device, the program characteristics are deteriorated, and also the reliability is deteriorated.

On the other hand, according to the embodiment, since the metal-containing layer 25 is provided, even if the floating gate electrode FG is made thin, electrons passing through the floating gate electrode FG can be trapped by the metal-containing layer 25. Therefore, the deterioration of the program characteristics can be suppressed, and also the reliability can be enhanced. In other words, while maintaining required program characteristics and reliability, the semiconductor memory device can be shrunk.

Further, in the embodiment, molybdenum is contained in the metal-containing layer 25. Molybdenum has a work function of, for example, 4.36 to 4.95 eV and a Fermi energy of, for example, 5.9 eV. The sum of the work function and the Fermi energy of molybdenum is relatively large, and therefore, a deep energy level can be formed with respect to the block insulating film 21 and the inter-electrode insulating film 22. As a result, the metal-containing layer 25 has a high ability to accumulate electrons.

Still further, in the semiconductor memory device 1 according to the embodiment, the inter-electrode insulating film 22 is provided between the floating gate electrode FG and the metal-containing layer 25, and therefore, the floating gate electrode FG and the metal-containing layer 25 can be electrically separated from each other. According to this, electrons injected through the tunneling insulating film 23 can be accumulated by being divided between the floating gate electrode FG and the metal-containing layer 25. As a result, an excessive electric field can be prevented from being applied to the tunneling insulating film 23 by excessively accumulating electrons in the floating gate electrode FG, and also an excessive electric field can be prevented from being applied to the block insulating film 21 by excessively accumulating electrons in the metal-containing layer 25. As a result, both of a leakage current flowing through the tunneling insulating film 23 and a leakage current flowing through the block insulating film 21 can be reduced.

Incidentally, in the embodiment, an example in which molybdenum is used as a metal to be contained in the metal-containing layer 25 has been shown, however, the metal is not limited thereto, and any metal can achieve the effect to a certain extent.

Further, in the embodiment, an example in which after forming the high dielectric constant layer 21c on an inner surface of the memory trench MT as shown in FIG. 8, the metal-containing layer 25 is formed by introducing molybdenum into the outermost layer of the high dielectric constant layer 21c as shown in FIGS. 9 and 10, and then, the inter-electrode insulating film 22 and the silicon film 33 are formed as shown in FIG. 11, and the silicon film 33, the inter-electrode insulating film 22, and the high dielectric constant layer 21c are divided for each recessed portion 32 as shown in FIG. 12 has been shown. However, the order of the processes for manufacturing the semiconductor memory device 1 is not limited thereto and is arbitrary. For example, the high dielectric constant layer 21c is formed and divided for each recessed portion 32 by RIE, followed by crystallization, and then, molybdenum is introduced into the high dielectric constant layer 21c and the interlayer insulating film 14, and then, a surface layer portion into which molybdenum is introduced in the interlayer insulating film 14 is removed by a wet treatment or the like using dilute hydrofluoric acid, whereby the inter-electrode insulating film 22 and the silicon film 33 are formed, and then, these members may be divided for each recessed portion 32.

According to the embodiment described above, a semiconductor memory device which is easy to shrink and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   an interconnect extending in a first direction;
   a semiconductor member extending in a second direction crossing the first direction;
   an electrode provided between the interconnect and the semiconductor member;
   a first insulating film provided between the interconnect and the electrode;
   a second insulating film provided between the first insulating film and the electrode;
   a third insulating film provided between the electrode and the semiconductor member; and
   a metal-containing layer provided between the first insulating film and the second insulating film or inside the first insulating film, and having a metal surface concentration of $1\times10^{14}$ cm$^{-2}$ or more and $5\times10^{15}$ cm$^{-2}$ or less.

2. The device according to claim 1, wherein the metal-containing layer is in contact with the second insulating film.

3. The device according to claim 1, wherein the metal is molybdenum.

4. The device according to claim 1, further comprises a substrate disposed on the second direction side of the semiconductor member, wherein
   the semiconductor member is connected to the substrate,
   the first direction is along a surface of the substrate, the semiconductor member is connected with the surface, and
   the second direction crosses the surface.

5. A semiconductor memory device, comprising:
   an interconnect extending in a first direction;
   a semiconductor member extending in a second direction crossing the first direction;
   an electrode provided between the interconnect and the semiconductor member;
   a first insulating film provided between the interconnect and the electrode;
   a second insulating film provided between the first insulating film and the electrode;
   a third insulating film provided between the electrode and the semiconductor member; and
   a metal-containing layer provided between the first insulating film and the second insulating film or inside the first insulating film, and containing molybdenum.

6. The device according to claim 5, wherein the metal-containing layer is in contact with the second insulating film.

7. The device according to claim 5, wherein the metal-containing layer has a metal surface concentration of $1\times10^{14}$ cm$^{-2}$ or more and $5\times10^{15}$ cm$^{-2}$ or less.

8. The device according to claim 5, wherein
   the first insulating film includes
   a first insulating layer which is in contact with the interconnect,
   a second insulating layer which has a dielectric constant lower than a dielectric constant of the first insulating layer, and
   a third insulating layer which is in contact with the second insulating film and has a dielectric constant higher than the dielectric constant of the second insulating layer, and
   the metal-containing layer is disposed in the third insulating layer.

9. The device according to claim 5, wherein the first insulating film contains hafnium, silicone and oxygen.

10. The device according to claim 5, wherein the electrode contains silicone.

11. The device according to claim 5, wherein the second insulating film contains silicone and nitrogen.

12. The device according to claim 5, further comprises a plurality of fourth insulating films mutually separately arranged along the second direction, wherein
    the interconnect, the first insulating film, the second insulating film, and the electrode are disposed between the fourth insulating films in the second direction, and
    the semiconductor member is disposed in a third direction viewed from the plurality of fourth insulating films, the third direction crosses a plane including the first direction and the second direction.

13. The device according to claim 12, wherein
    a plurality of the semiconductor members is provided and arranged along the first direction, and
    the metal-containing layer and the electrode are divided for each semiconductor member along the first direction.

14. The device according to claim 13, wherein the third insulating film, the electrode, the second insulating film, the first insulating film, and the interconnect are disposed in this order from a side of the semiconductor member respectively on both sides in the third direction of the semiconductor member, and between two interconnects on both sides, two memory cells are formed.

15. A method for manufacturing a semiconductor memory device, comprising:
    forming a stacked body by alternately stacking a first film and a second film on a substrate;
    forming a first trench extending in a first direction on the stacked body;
    forming a first recessed portion extending in the first direction on a side surface of the first trench by removing a portion of the second film through the first trench;
    forming a first insulating film on an inner surface of the first recessed portion;
    forming a metal-containing layer by introducing a metal to a surface of the first insulating film;
    forming a second insulating film on a surface of the first insulating film;
    forming an electrode in the first recessed portion;
    forming a third insulating film on a side surface of the first trench;
    forming a semiconductor member in the first trench;
    dividing the semiconductor member, the third insulating film, the electrode, the second insulating film, and the metal-containing layer in the first direction;
    forming a second trench extending in the first direction in the stacked body;

forming a second recessed portion extending in the first direction on a side surface of the second trench by removing a residual portion of the second film through the second trench; and forming an interconnect in the second recessed portion.

16. The method according to claim 15, wherein the introduction of the metal is performed by a plasma doping method.

17. The method according to claim 15, wherein the metal is molybdenum.

18. The method according to claim 15, wherein the introduction of the metal is performed by a plasma doping method using molybdenum pentachloride or molybdenum hexafluoride as a raw material.

19. The method according to claim 15, wherein an introduction amount of the metal is set to $1 \times 10^{14}$ cm$^{-2}$ or more and $5 \times 10^{15}$ cm$^{-2}$ or less.

20. The method according to claim 15, wherein the first insulating film is insulation.

* * * * *